(12) United States Patent
Shen et al.

(10) Patent No.: US 10,644,839 B2
(45) Date of Patent: May 5, 2020

(54) CODEWORD PUNCTURING FOR VARYING CODE RATES

(71) Applicant: BROADCOM CORPORATION, Irvine, CA (US)

(72) Inventors: Bazhong Shen, Irvine, CA (US); Payam Torab Jahromi, Laguna Niguel, CA (US)

(73) Assignee: AVAGO TECHNOLOGIES INTERNATIONAL SALES PTE. LIMITED, Singapore (SG)

(*) Notice: Subject to any disclaimer, the term of this patent is extended or adjusted under 35 U.S.C. 154(b) by 62 days.

(21) Appl. No.: 15/259,006

(22) Filed: Sep. 7, 2016

(65) Prior Publication Data
US 2017/0207881 A1 Jul. 20, 2017

Related U.S. Application Data

(60) Provisional application No. 62/279,606, filed on Jan. 15, 2016.

(51) Int. Cl.
H04L 1/00 (2006.01)
H03M 13/00 (2006.01)
H03M 13/35 (2006.01)
H03M 13/11 (2006.01)

(52) U.S. Cl.
CPC ....... *H04L 1/0068* (2013.01); *H03M 13/1102* (2013.01); *H03M 13/353* (2013.01); *H03M 13/6356* (2013.01); *H04L 1/0041* (2013.01); *H04L 1/0057* (2013.01)

(58) Field of Classification Search
CPC ... H04L 1/0069; H04L 1/0066; H04L 1/0068; H04L 1/0041; H04L 1/0057; H03M 13/6362; H03M 13/353; H03M 13/6356; H03M 13/1102
USPC ........................................................ 714/790
See application file for complete search history.

(56) References Cited

U.S. PATENT DOCUMENTS 7,293,217 B2 * 11/2007 Pietraski ........... H03M 13/2957
375/265
8,132,072 B2 * 3/2012 El-Khamy .......... H03M 13/033
714/755
8,181,099 B2 * 5/2012 Miyazaki .......... H03M 13/2903
714/701

(Continued)

Primary Examiner — Albert Decady
Assistant Examiner — Enam Ahmed
(74) Attorney, Agent, or Firm — Morgan, Lewis & Bockius LLP

(57) ABSTRACT

A system of codeword puncturing for varying code rates may include at least one transmitter circuit. The at least one transmitter circuit may be configured to perform error correction coding to generate codewords at a first code rate. The at least one transmitter circuit may be further configured to puncture a number of bits from a location within each of the codewords to implement a second code rate that is greater than the first code rate. The at least one transmitter circuit may be further configured to provide the punctured codewords for transmission. The device may further include at least one receiver circuit that may be configured to receive bit sequences comprising received punctured codewords. The at least one receiver circuit may be further configured to insert bits into the bit sequences to compensate for the puncturing and perform error correction decoding on the bit sequences including the inserted bits.

20 Claims, 10 Drawing Sheets

(56) References Cited

U.S. PATENT DOCUMENTS

| | | | |
|---|---|---|---|
| 8,504,887 B1* | 8/2013 | Varnica | H03M 13/1111 |
| | | | 714/730 |
| 9,385,752 B2* | 7/2016 | Loghin | H03M 13/036 |
| 2001/0037485 A1* | 11/2001 | Zhang | H04B 7/0845 |
| | | | 714/790 |
| 2003/0126551 A1* | 7/2003 | Mantha | H03M 13/1102 |
| | | | 714/790 |
| 2006/0013181 A1* | 1/2006 | Stolpman | H03M 13/03 |
| | | | 370/342 |
| 2006/0031737 A1* | 2/2006 | Chugg | H03M 13/095 |
| | | | 714/755 |
| 2006/0090120 A1* | 4/2006 | Chen | H03M 7/46 |
| | | | 714/790 |
| 2007/0071119 A1* | 3/2007 | Davydov | H04L 1/0041 |
| | | | 375/260 |
| 2007/0086539 A1* | 4/2007 | Hocevar | H03M 13/1185 |
| | | | 375/267 |
| 2008/0016433 A1* | 1/2008 | Stolpman | H03M 13/033 |
| | | | 714/786 |
| 2009/0006906 A1* | 1/2009 | Jacobsen | H03M 13/033 |
| | | | 714/52 |
| 2009/0259915 A1* | 10/2009 | Livshitz | H03M 13/1111 |
| | | | 714/758 |
| 2010/0205511 A1* | 8/2010 | Murakami | H03M 13/118 |
| | | | 714/781 |
| 2013/0139025 A1* | 5/2013 | Gioulekas | H03M 13/13 |
| | | | 714/752 |
| 2017/0359148 A1* | 12/2017 | Richardson | H03M 13/1148 |

* cited by examiner

Modulation and coding scheme for SC

| MCS index | Modulation | N_cbps | Repetition | Code rate | Data rate (Mbps) |
|---|---|---|---|---|---|
| 1 | π/2-BPSK | 1 | 2 | 1/2 | 385 |
| 2 | π/2-BPSK | 1 | 1 | 1/2 | 770 |
| 3 | π/2-BPSK | 1 | 1 | 5/8 | 962.5 |
| 4 | π/2-BPSK | 1 | 1 | 3/4 | 1155 |
| 5 | π/2-BPSK | 1 | 1 | 13/16 | 1251.25 |
| 6 | π/2-QPSK | 2 | 1 | 1/2 | 1540 |
| 7 | π/2-QPSK | 2 | 1 | 5/8 | 1925 |
| 8 | π/2-QPSK | 2 | 1 | 3/4 | 2310 |
| 9 | π/2-QPSK | 2 | 1 | 13/16 | 2502.5 |
| 10 | π/2-16QAM | 4 | 1 | 1/2 | 3080 |
| 11 | π/2-16QAM | 4 | 1 | 5/8 | 3850 |
| 12 | π/2-16QAM | 4 | 1 | 3/4 | 4620 |

FIG. 5

Modulation and coding scheme for OFDM

| MCS index | Modulation | Code rate | N_BPSC | N_CBPS | N_DBPS | Data rate (Mbps) |
|---|---|---|---|---|---|---|
| 13 | SQPSK | 1/2 | 1 | 336 | 168 | 693.00 |
| 14 | SQPSK | 5/8 | 1 | 336 | 210 | 866.25 |
| 15 | QPSK | 1/2 | 2 | 672 | 336 | 1386.00 |
| 16 | QPSK | 5/8 | 2 | 672 | 420 | 1732.50 |
| 17 | QPSK | 3/4 | 2 | 672 | 504 | 2079.00 |
| 18 | 16-QAM | 1/2 | 4 | 1344 | 672 | 2772.00 |
| 19 | 16-QAM | 5/8 | 4 | 1344 | 840 | 3465.00 |
| 20 | 16-QAM | 3/4 | 4 | 1344 | 1008 | 4158.00 |
| 21 | 16-QAM | 13/16 | 4 | 1344 | 1092 | 4504.50 |

| MCS index | Modulation | Code rate | N_BPSC | N_CBPS | N_DBPS | Data rate (Mbps) |
|---|---|---|---|---|---|---|
| 22 | 64-QAM | 5/8 | 6 | 2016 | 1260 | 5197.50 |
| 23 | 64-QAM | 3/4 | 6 | 2016 | 1512 | 6237.00 |
| 24 | 64-QAM | 13/16 | 6 | 2016 | 1638 | 6756.75 |

FIG. 8

CODEWORD PUNCTURING FOR VARYING CODE RATES

CROSS-REFERENCE TO RELATED APPLICATIONS

The present application claims the benefit of U.S. Provisional Patent Application Ser. No. 62/279,606, entitled "Signal-to-Noise Ratio (SNR) Granularity," filed on Jan. 15, 2016, which is hereby incorporated by reference in their entireties for all purposes.

TECHNICAL FIELD

The present description relates generally to codeword puncturing, including codeword puncturing for varying code rates.

BACKGROUND

In devices that utilize variable code rate error correction coding, such as low-density parity-check (LDPC) error correction coding, separate parity check and/or generator matrices may be required for providing each of the different code rates. Thus, a device implementing variable code rates may locally store multiple different parity check and/or generator matrices. Accordingly, in order to add additional code rates, additional parity check and/or generator matrices may need to be stored on the device and/or existing parity check and/or generator matrices may be modified, such as by removing one or more rows and/or one or more columns. However, it may be difficult to add additional parity check and/or generator matrices to existing devices and modifying existing parity check and/or generator matrices may have suboptimal results, e.g. by introducing short cycles.

BRIEF DESCRIPTION OF THE DRAWINGS

Certain features of the subject technology are set forth in the appended claims. However, for purpose of explanation, several embodiments of the subject technology are set forth in the following figures.

FIG. 5 illustrates an example modulation and coding scheme table for single carrier in a system of codeword puncturing for varying code rates in accordance with one or more implementations.

FIG. 8 illustrates an example modulation and coding scheme table for orthogonal frequency-division multiplexing (OFDM) in a system of codeword puncturing for varying code rates in accordance with one or more implementations.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

In the subject system, additional code rates are generated from existing parity check and/or generator matrices by puncturing a certain number of data and/or redundancy bits of each codeword (or any number of the codewords) output by an forward error correction encoder, such as a low density parity check (LDPC) encoder to vary a given code rate, e.g. in order to achieve a higher code rate. In this manner, additional code rates can be achieved without having to modify the LDPC encoder and/or the associated matrices. Thus, the subject system allows for LDPC encoders and matrices of existing devices to remain intact and only requires modifying the output of the LDPC encoder to achieve additional code rates.

In the subject system, the number of bits that are punctured, and the location of the bits within the codeword that are punctured, e.g. the puncture window, may be adjustable to adapt to characteristics of different wireless or wire environments. For example, a transmitter and receiver may negotiate an appropriate number of bits, and a location of the bits, to puncture from codewords of a given code rate to achieve a higher code rate. The puncturing may be performed at any location of each codeword, and the puncturing may be modified during transmission, such as from codeword to codeword, from packet to packet, etc. For example, the transmitter and receiver may modify the puncturing during transmission based on a known or advertised pattern available to the transmitter and receiver, such as to increase the puncturing to account for better than expected link conditions. The LDPC decoder of the receiver may zero pad (or otherwise fill) an incoming soft or hard decision bit sequence from the receiver at appropriate intervals, e.g. to account for the puncturing, and may then decode the sequence as an unpunctured, or depunctured, codeword.

Figure 1:
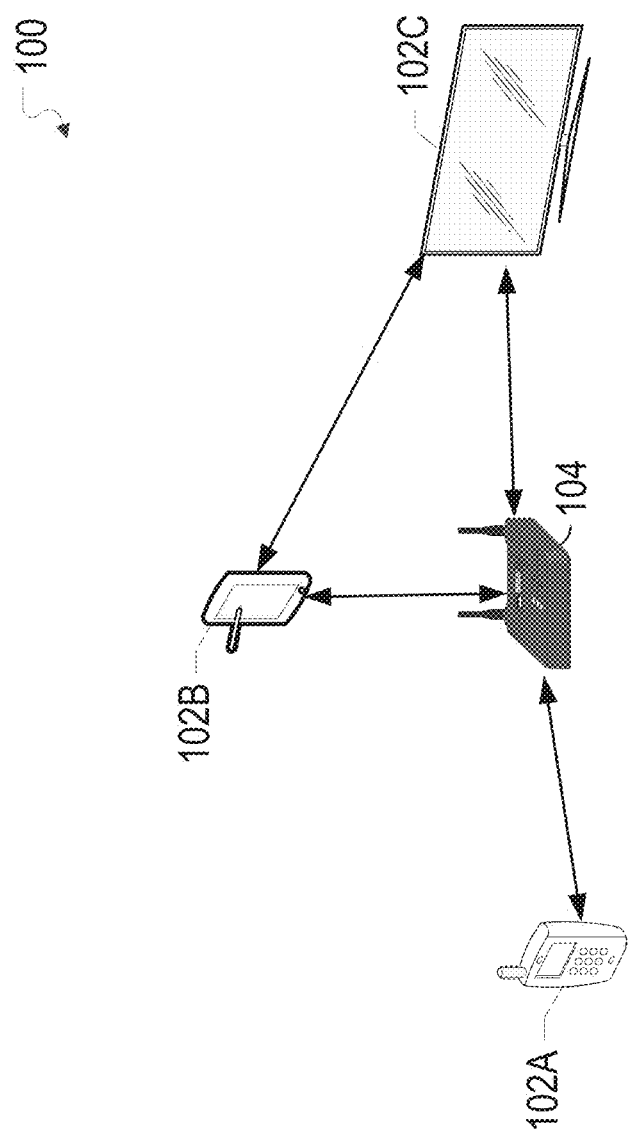
FIG. 1 illustrates an example network environment in which a system of codeword puncturing for varying code rates may be implemented in accordance with one or more implementations.

FIG. 1 illustrates an example network environment 100 in which a system of codeword puncturing for varying code rates may be implemented in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The example network environment 100 includes one or more electronic devices 102A-C and at least one base station device 104. The base station device 104 may be coupled to a network, such as the Internet, via wireless or wired transmission media, such as a fiber optic transmission media. In one or more implementations, the transmission media may be shared by tens, hundreds, thousands, or any number of base station devices and/or nodes.

The electronic devices 102A-C may communicate with the base station device 104 using one or more wireless communication technologies, such as Wi-Fi (e.g. 802.11 ac, 802.11 ad, etc.), cellular (e.g. 3G, 4G, 5G, etc.), and/or mmWave (e.g. 802.1 lay, etc.). The electronic devices 102A-C may communicate with the base station device 104 using single carrier transmissions and/or multi-carrier transmissions, such as orthogonal frequency-division multiplexing transmissions.

In one or more implementations, one or more of the electronic devices 102A-C may communicate with the base station device 104 over a wired transmission medium, such as a powerline transmission medium, a coaxial transmission medium, an optical transmission, an Ethernet transmission medium, and the like. One or more of the electronic devices 102A-C may also communicate directly with one another, e.g. bypassing the base station device 104.

The base station device 104 may select an appropriate modulation and coding scheme ("MCS") for communicating with one or more of the electronic devices 102A-C, such as the electronic device 102A, and may signal the modulation and coding scheme to the electronic device 102A. For example, the base station device 104 may select the modulation and coding scheme based on link conditions, e.g. as indicated by BLER as a function of SNR, between the base station device 104 and the electronic device 102A. The base station device 104 may select the MCS from a set of MCSs that are known apriori to both the base station device 104 and the electronic device 102A, such as via the tables discussed further below with respect to FIGS. 5 and 8.

However, in some instances there may be a SNR gap between adjacent MCSs in the set of MCSs, as is discussed further below with respect to the graphs of FIGS. 6, 7, and 9. In this instance, the base station device 104 and/or the electronic device 102A may utilize the subject system to vary the code rate of one of the MCSs by performing codeword puncturing. An example process of a transmitter device, such as the base station device 104, implementing the subject system is discussed further below with respect to FIG. 3, and an example process of a receiver device, such as the electronic device 102A, implementing the subject system is discussed further below with respect to FIG. 4. The codeword puncturing allows the base station device 104 and/or the electronic device 102A to reduce the total number of bits for each codeword, thereby effectively increasing the code rate.

Figure 2:
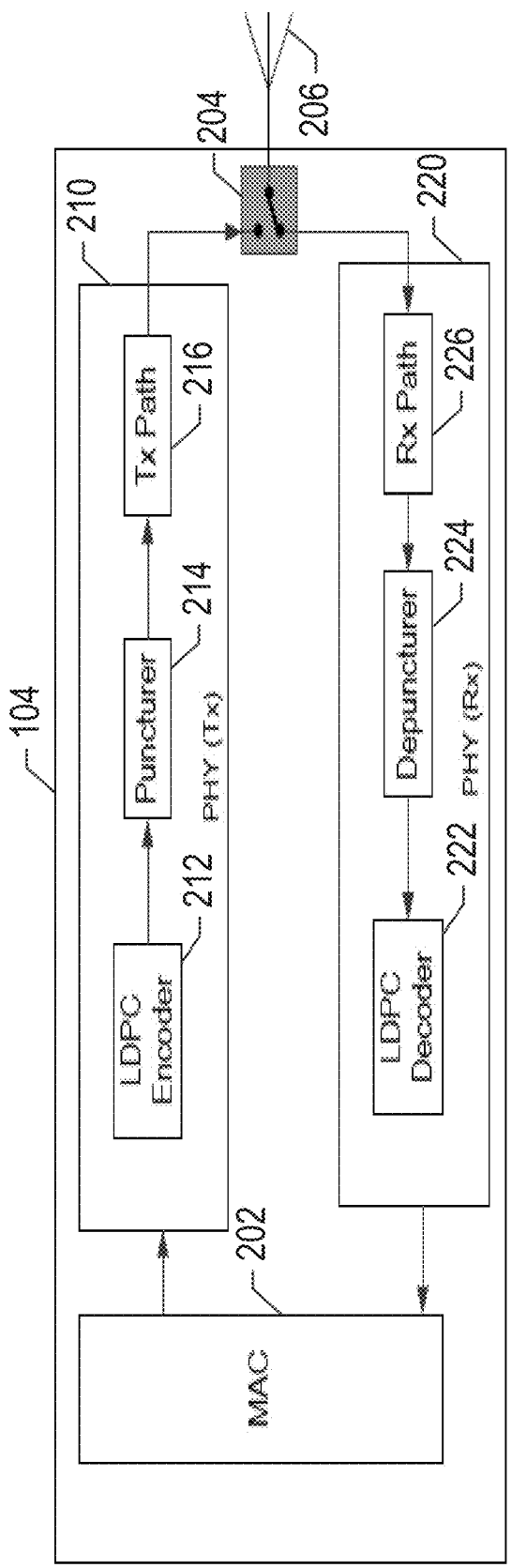
FIG. 2 illustrates an example base station device implementing a system of codeword puncturing for varying code rates in accordance with one or more implementations.

FIG. 2 illustrates an example base station device 104 implementing a system of codeword puncturing for varying code rates in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided. In one or more implementations, one or more components of the example base station device 104 may be implemented by one or more of the electronic devices 102A-C.

The example base station device 104 includes a media access control (MAC) module, a switch 204, an antenna 206 (e.g. single antenna, phased array, etc.), transmit PHY circuitry 210, and receive PHY circuitry 220. The transmit PHY circuitry 210 includes a low density parity check encoder (LDPC) 212, a puncturer circuit 214, and a transmit path 216 that may include, for example, mixers, filters, power amplifiers, etc. The receive PHY circuitry 220 includes an LDPC decoder 222, a depuncturer circuit 224, and a receive path 226 that may include, for example, filters, low noise amplifiers, etc. The switch 204 is configured to switch between the transmit PHY circuitry 210 and the receive PHY circuitry 220 to facilitate transmitting and receiving signals.

In operation, the base station device 104 may negotiate an MCS and one or more puncturing parameters with a receiver device, such as the electronic device 102A. The one or more puncturing parameters may include, for example, a number of bits to puncture from each codeword and an offset indicating where to begin puncturing bits from each codeword. For example, the base station device 104 may determine the appropriate MCS and one or more puncturing parameters based on link conditions between the base station device 104 and the electronic device 102A, and the base station device 104 may transmit an indication of the MCS and/or the one or more puncturing parameters to the electronic device 102A. The base station device 104 may transmit an index value that is mapped, at the base station device 104 and the electronic device 102A, to one or more puncturing parameters.

The MAC module 202 provides data bits to the transmit PHY circuitry 210. The LDPC encoder 212 performs error correction coding on the data bits to generate codewords. The puncturer circuit 214 punctures the codewords based at least in part on the one or more puncturing parameters negotiated with the electronic device 102A, thereby effectively increasing the code rate. The punctured codewords are passed to the transmit path 216, through the switch 204 and transmitted over the antenna 206.

Similarly, the base station device 104 negotiates an appropriate MCS and one or more puncturing parameters with the electronic device 102A for uplink transmissions from the electronic device 102A to the base station device 104. The antenna 206 receives the transmissions from the electronic device 102A and passes the transmissions to the receive PHY circuitry 220 via the switch 204. The receive path 226 passes bit sequences, such as soft or hard decision sequences, to the depuncturer circuit 224. The depuncturer circuit 224 inserts bits (e.g. zero padding) into the bit sequences based at least in part on the one or more puncturing parameters for the transmissions from the electronic device 102A. The depuncturer circuit 224 passes the bit sequences with the inserted bits to the LDPC decoder 222 to be used as codewords for forward error correction decoding. The LDPC decoder 222 recovers data bits from the codewords and passes the data bits to the MAC module 202.

In one or more implementations, one or more of the MAC module 202, the transmit PHY circuitry 210, the LDPC encoder 212, the puncturer circuit 214, the transmit path 216, the switch 204, the antenna 206, the receive PHY circuitry 220, the receive path 226, the depuncturer circuit 224, and/or the LDPC decoder 222, may be implemented in software (e.g., subroutines and code), may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or a combination of both.

Figure 3:
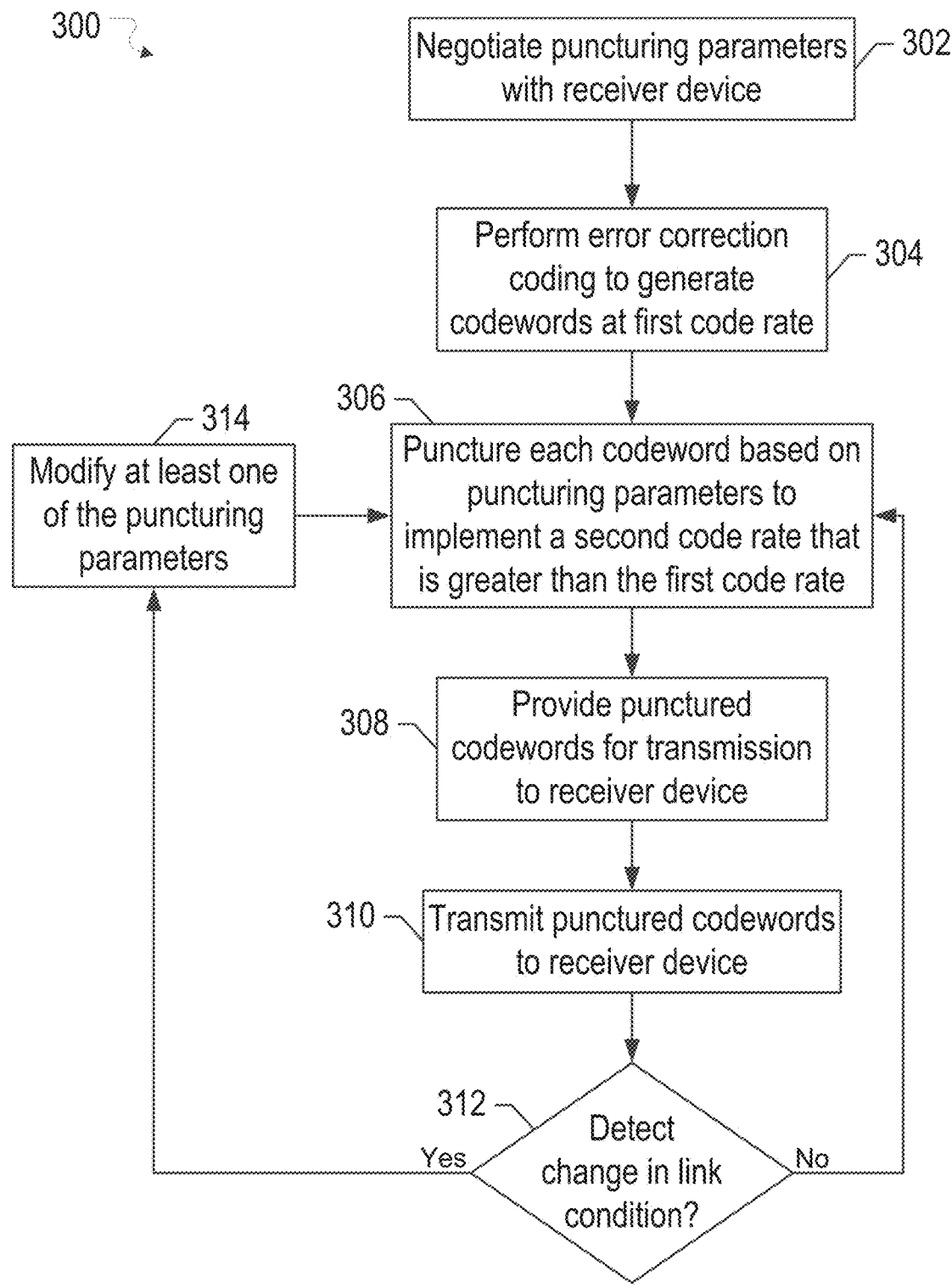
FIG. 3 illustrates a flow diagram of an example process of a transmitter device in a system of codeword puncturing for varying code rates in accordance with one or more implementations.

FIG. 3 illustrates a flow diagram of an example process 300 of a transmitter device in a system of codeword puncturing for varying code rates in accordance with one or more implementations. For explanatory purposes, the example process 300 is described herein with reference to the base station device 104 and the electronic device 102A of FIGS. 1 and 2; however, the example process 300 is not limited to the base station device 104 or the electronic device 102A of FIGS. 1 and 2. For example, the example process 300 may also be implemented by one or more of the other electronic devices 102B-C. Further for explanatory purposes, the blocks of the example process 300 are described herein as occurring in serial, or linearly. However, multiple blocks of the example process 300 may occur in parallel. In addition, the blocks of the example process 300 need not be performed in the order shown and/or one or more of the blocks of the example process 300 need not be performed.

The base station device 104 negotiates puncturing parameters with a receiver device, such as the electronic device 102A (302). For example, the base station device 104 may determine one or more metrics indicative of a link condition between the base station device 104 and the electronic device 102A, such as a channel quality index received from the electronic device 102A, a SNR, and the like. Based at least in part on the link condition, e.g. as indicated by the one or more metrics, the base station device 104 may determine that the appropriate code rate for the channel falls into an SNR gap between two sequential MCSs known apriori to the base station device 104 and the electronic device 102A (e.g. as discussed below with respect to FIGS. 7 and 9). In this instance, the base station device 104 transmits an indication of the MCS having the lower code rate to the electronic device 102A along with an indication of one or more puncturing parameters to fill the SNR gap. In one or more implementations, the one or more puncturing parameters may be determined unilaterally by the base station device 104 and/or in conjunction with the electronic device 102A.

The puncturing parameters indicate the manner in which the codewords will be punctured by the base station device 104 and therefore should also be de-punctured by the electronic device 102A. The puncturing parameters may include, for example, a number of bits of each codeword, packet, or any definable data unit to puncture. The number of bits may be the same for each codeword or may differ from codeword to codeword. The puncturing parameters may further include an offset that indicates a location within each codeword, packet, etc. that the base station device 104 will begin puncturing bits, and therefore the location where the electronic device 102A should begin depuncturing, e.g. inserting bits. The puncturing parameters may also be or may include a puncturing pattern that indicates the bits that will be punctured over a determined number of bits, such as a number of codewords, packets, etc.

In one or more implementations, the base station device 104 and/or the electronic device 102A may pre-store sets of puncturing parameters that are each associated with, for example, a puncturing index. In this instance, the base station device 104 may signal, to the electronic device 102A, a puncturing index that corresponds to the one or more puncturing parameters determined by the base station.

The base station device 104 then receives data bits, e.g. from the MAC module 202, and performs error correction coding on the data bits, e.g. using the LDPC encoder 212, to generate codewords at the first code rate, e.g. at the lower code rate of the two sequential MCSs that surround the SNR gap (304). The base station device 104 punctures each codeword based at least in part on the one or more puncturing parameters to implement the determined appropriate code rate, e.g. a second code rate that is greater than the first code rate (306). The base station device 104 then provides the punctured codewords, e.g. to the transmit path 216, for transmission to a receiver device, such as the electronic device 102A (308). The base station device 104 transmits the punctured codewords to the receiver device, e.g. via the antenna 206 (310).

Intermittently, or continuously, the base station device 104 monitors the link condition between the base station device 104 and the electronic device 102A. For example, the base station device 104 may continuously receive one or more metrics from the electronic device 102A that are indicative of the link condition. If the base station device 104 detects a change in the link condition that impacts the puncturing and/or the appropriate code rate (312), the base station device 104 modifies at least one of the puncturing parameters to adjust for the change in the link condition (314). For example, the base station device 104 may adjust the number of bits being punctured and/or the location within the codewords at which the bits are being punctured. The base station device 104 may transmit an indication of the adjustment to the electronic device 102A, along with a time at which the electronic device 102A should implement the adjustment, and then the base station device 104 may begin puncturing the codewords based on the adjusted one or more puncturing parameters (306).

If the base station device 104 detects no change in the link condition and/or no change in the link condition that substantively impacts the puncturing and/or the appropriate code rate (312), the base station device 104 continues to puncture the codewords based on the negotiated puncturing parameters (306).

Figure 4:
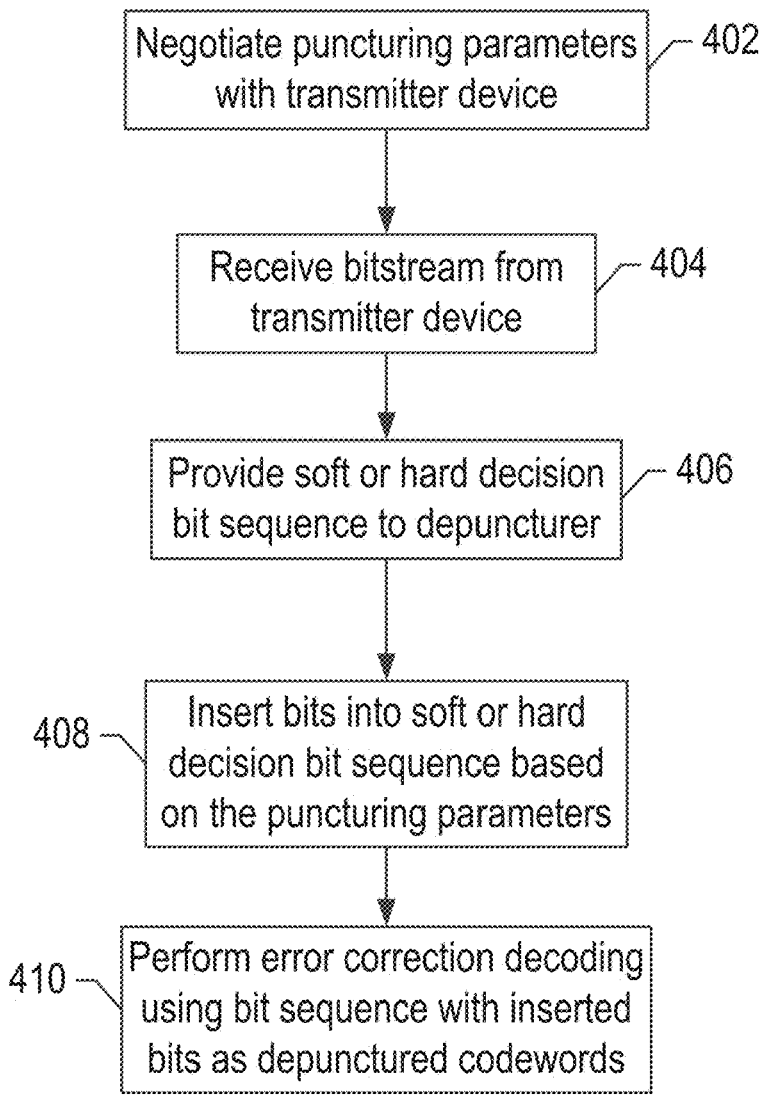
FIG. 4 illustrates a flow diagram of an example process of a receiver device in a system of codeword puncturing for varying code rates in accordance with one or more implementations.

FIG. 4 illustrates a flow diagram of an example process 400 of a receiver device in a system of codeword puncturing for varying code rates in accordance with one or more implementations. For explanatory purposes, the example process 400 is described herein with reference to the electronic device 102A and the base station device 104 and of FIGS. 1 and 2; however, the example process 400 is not limited to the base station device 104 or the electronic device 102A of FIGS. 1 and 2. For example, the example process 400 may also be implemented by one or more of the other electronic devices 102B-C. Further for explanatory purposes, the blocks of the example process 400 are described herein as occurring in serial, or linearly. However, multiple blocks of the example process 400 may occur in parallel. In addition, the blocks of the example process 400 need not be performed in the order shown and/or one or more of the blocks of the example process 400 need not be performed.

The electronic device 102A negotiates puncturing parameters with a transmitter device, such as the base station device 104 (402). For example, the electronic device 102A may transmit, to the base station device 104, one or more metrics indicative of a link condition between the electronic device 102A and the base station device 104, such as a channel quality index, a SNR, and/or the like. Based at least in part on the link condition, the electronic device 102A and/or the base station device 104 may determine that the appropriate code rate for the channel falls into a SNR gap between two sequential MCSs known apriori to the electronic device 102A and the base station device 104. In this instance, the electronic device 102A may receive, from the base station device 104, an indication of the one of the two sequential MCSs having the lower code rate along with an indication of one or more puncturing parameters to achieve the determined appropriate code rate. In one or more implementations, the one or more puncturing parameters may be determined by the electronic device 102A and provided to the base station device 104.

The electronic device 102A receives a bitstream from the transmitter device, e.g. the base station device 104 (404). The electronic device 102A provides soft or hard decision bit sequences from the bitstream to the depuncturer circuit 224 (406). In one or more implementations, the depuncturer circuit 224 may be part of the LDPC decoder 222. The depuncturer circuit 224 inserts bits into the soft or hard decision bit sequence based on the puncturing parameters (408). For example, the depuncturer circuit 224 may zero pad, e.g. insert zeros, into the soft or hard decision bit sequences to account for the bits that were punctured out by the transmitter device, e.g. the base station device 104.

The depuncturer circuit 224 passes the soft or hard decision bit sequences with the inserted bits to the LDPC decoder 222. The LDPC decoder 410 performs forward error correction decoding using the soft or hard decision bit sequences with the inserted bits as depunctured codewords (410). In one or more implementations, the LDPC decoder 410 may pass the recovered data bits to the MAC module 202. If the electronic device 102A receives an indication of adjusted puncturing parameters from the base station device 104, the electronic device 102A may adjust the puncturing parameters as indicated at a time specified by the base station device 104, e.g. in synchronization with the adjustment of the puncturing parameters at the base station device 104.

FIG. 5 illustrates an example modulation and coding scheme table 500 for single carrier in a system of codeword puncturing for varying code rates in accordance with one or more implementations. The table 500 illustrates the Institute of Electrical and Electronics Engineers (IEEE) 802.11 lad modulation and coding scheme (MCS) for single carrier. The modulation and coding schemes corresponding to MCS indices 8-10 are discussed further below with regard to FIGS. 6 and 7.

Figure 6:
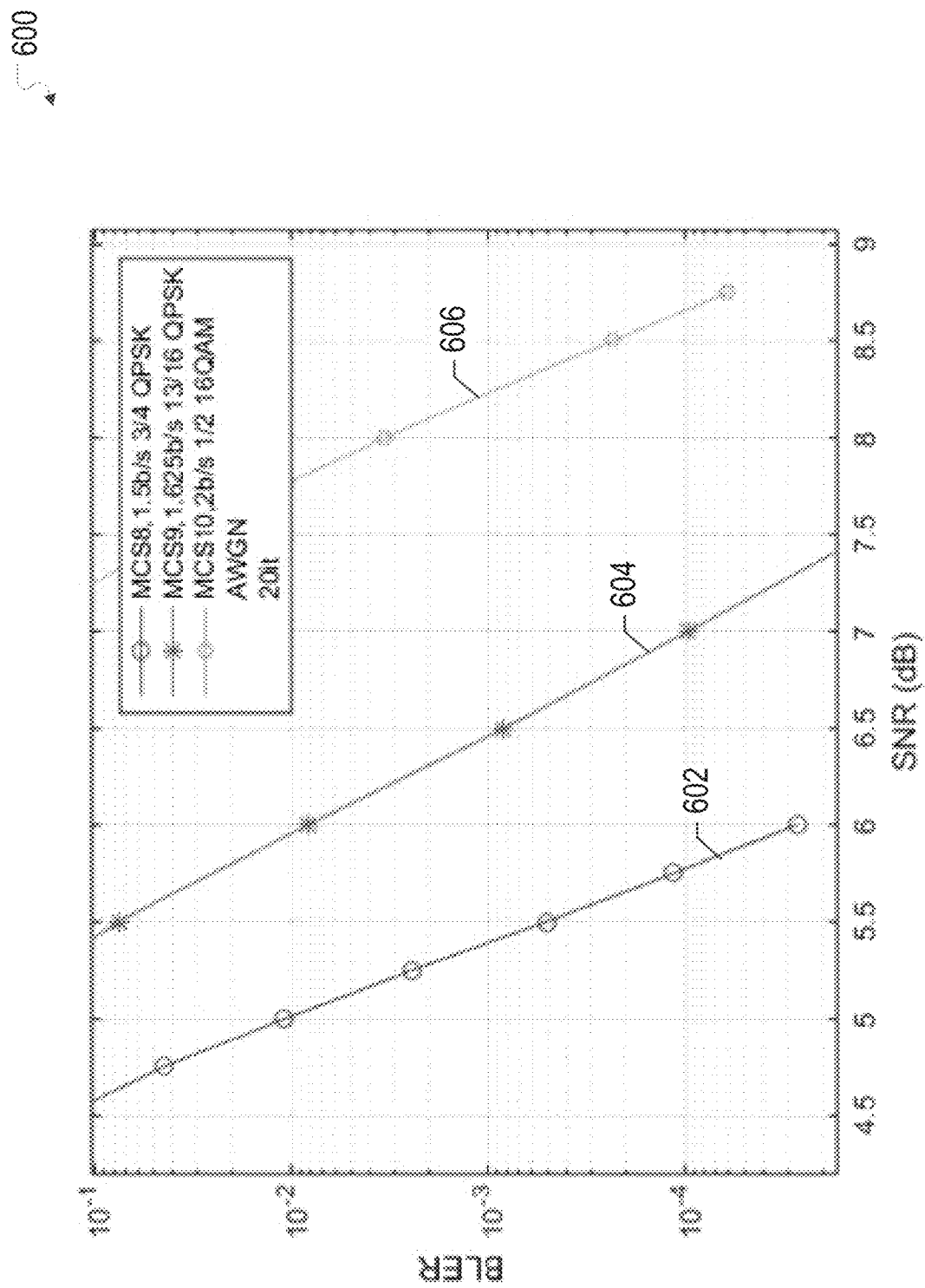
FIG. 6 illustrates an example graph of block error rate (BLER) as a function of signal to noise ratio (SNR) for three modulation and coding schemes in a system of codeword puncturing for varying code rates in accordance with one or more implementations.

FIG. 6 illustrates an example graph 600 of block error rate (BLER) as a function of signal to noise ratio (SNR) for three modulation and coding schemes in a system of codeword puncturing for varying code rates in accordance with one or more implementations.

The example graph 600 includes a data line 602 for the modulation and coding scheme of the table 500 corresponding to the MCS index 8, a data line 604 for the modulation and coding scheme of the table 500 corresponding to the MCS index 9, and a data line 606 for the modulation and coding scheme of the table 500 corresponding to the MCS index 10. As illustrated in the example graph 600, there is a determinable SNR gap between the data line 604 corresponding to the MCS index 9 and the data line 606 corresponding to the MCS index 10.

Figure 7:
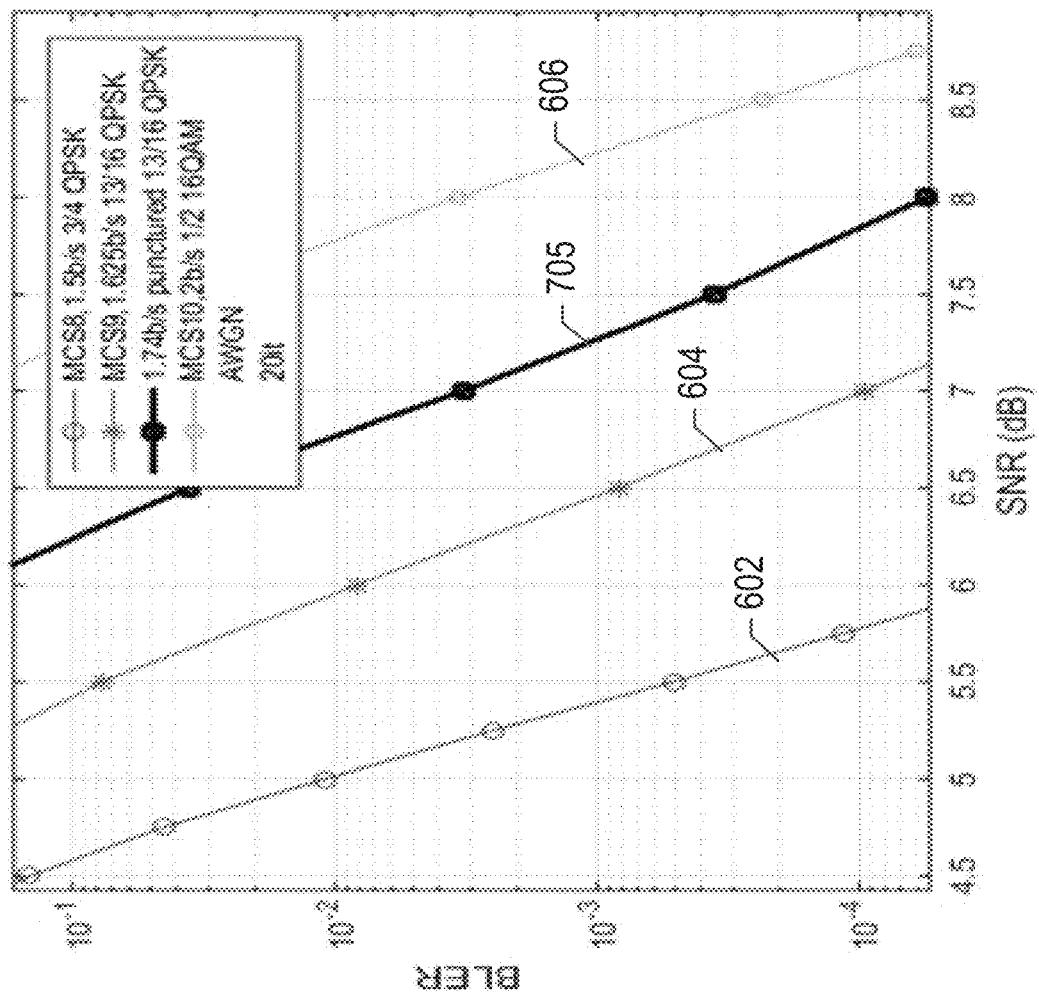
FIG. 7 illustrates an example graph of BLER as a function of SNR for three modulation and coding schemes and a code rate provided by implementing codeword puncturing on one of the modulation and coding schemes in accordance with one or more implementations.

FIG. 7 illustrates an example graph 700 of BLER as a function of SNR for three modulation and coding schemes and a code rate provided by implementing codeword puncturing on one of the modulation and coding schemes in accordance with one or more implementations.

The example graph 700 includes the data line 602 for the modulation and coding scheme of the table 500 corresponding to the MCS index 8, the data line 604 for the modulation and coding scheme of the table 500 corresponding to the MCS index 9, the data line 606 for the modulation and coding scheme of the table 500 corresponding to the MCS index 10, and a data line 705 corresponding to a code rate provided by implementing the subject system of codeword puncturing on the modulation and coding scheme corresponding to the MCS index 9.

For example, the data line 705 may correspond to a code rate provided by puncturing a number of bits of each codeword of the 13/16 code of the modulation and coding scheme of the table 500 corresponding to the MCS index 9, such as the first 46 redundancy bits of each codeword. As illustrated in the example graph 700, the data line 705 evenly fills the SNR gap between the modulation and coding schemes corresponding to the MCS indices 9 and 10, e.g. as represented by the data lines 604 and 606, respectively.

FIG. 8 illustrates an example modulation and coding scheme table 800 for orthogonal frequency-division multiplexing (OFDM) in a system of codeword puncturing for varying code rates in accordance with one or more implementations. The table 800 illustrates the IEEE802.11ad modulation and coding scheme for OFDM. The modulation and coding schemes of the table 800 that correspond to MCS indices 21 and 22 are discussed further below with regard to FIG. 9.

Figure 9:
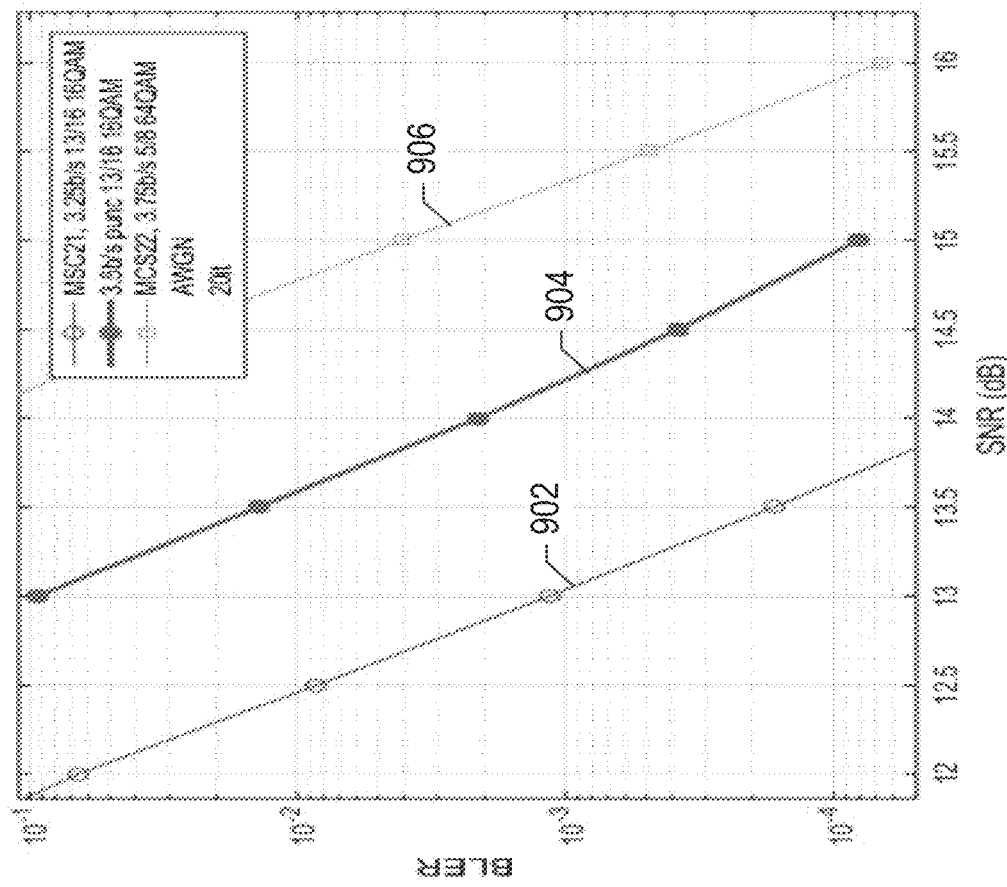
FIG. 9 illustrates an example graph of BLER as a function of SNR for two modulation and coding schemes a code rate provided by implementing codeword puncturing on one of the modulation and coding schemes in accordance with one or more implementations.

FIG. 9 illustrates an example graph 900 of BLER as a function of SNR for two modulation and coding schemes a code rate provided by implementing codeword puncturing on one of the modulation and coding schemes in accordance with one or more implementations.

The example graph 900 includes a data line 902 for the modulation and coding scheme of the table 800 corresponding to the MCS index 21, a data line 906 for the modulation and coding scheme of the table 800 corresponding to the MCS index 22, a data line 904 corresponding to a code rate provided by implementing the subject system of codeword puncturing on the modulation and coding scheme corresponding to the MCS index 21.

For example, data line 904 may correspond to a code rate provided by puncturing a number of bits of each codeword of the 13/16 code of the modulation and coding scheme of the table 800 that corresponds to the MCS index 21, such as the first 48 redundancy bits. As illustrated in the example graph 900, the data line 904 even fills the gap between the modulation and coding schemes corresponding to the MCS indices 21 and 22, e.g. as represented by the data lines 902 and 906, respectively.

For explanatory purposes, the subject system is discussed herein with respect to the SNR gaps between the MCS index 9 and the MCS index 10 of the example table 500, and the MCS index 21 and the MCS index 22 of the example table 800. However, the subject system may also be used to fill other gaps in the example tables 500, 800, and/or the subject system may be similarly used to fill gaps in other modulation and coding scheme tables and/or other systems that utilize variable code rate error correction coding.

Figure 10:
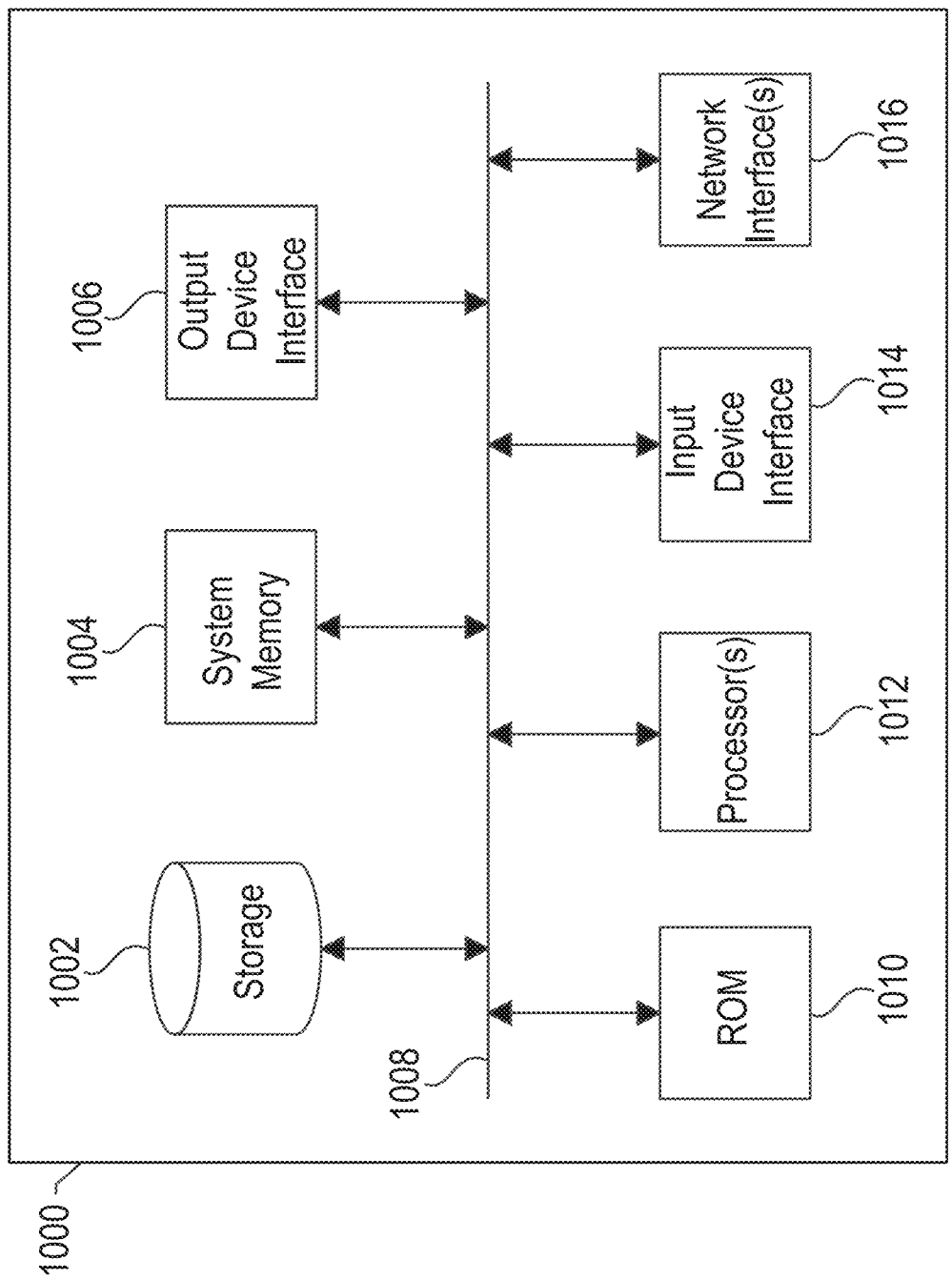
FIG. 10 conceptually illustrates an electronic system with which one or more implementations of the subject technology may be implemented.

FIG. 10 conceptually illustrates an electronic system 1000 with which one or more implementations of the subject technology may be implemented. The electronic system 1000, for example, may be, or may be coupled to, a powertrain system, a chassis system, a telematics system, an entertainment system, a camera system, a sensor system, such as a lane departure system, a diagnostics system, a gateway device, a set-top box, a desktop computer, a laptop computer, a tablet computer, a server, a switch, a router, a base station, a receiver, a phone, a personal digital assistant (PDA), or generally any electronic device that transmits signals over a network. The electronic system 1000 can be, and/or can be a part of, one or more of the electronic devices 102A-C and/or the base station device 104. Such an electronic system includes various types of computer readable media and interfaces for various other types of computer readable media. The electronic system 1000 includes a bus 1008, one or more processor(s) 1012, a system memory 1004 or buffer, a read-only memory (ROM) 1010, a permanent storage device 1002, an input device interface 1014, an output device interface 1006, and one or more network interface(s) 1016, or subsets and variations thereof.

The bus 1008 collectively represents all system, peripheral, and chipset buses that communicatively connect the numerous internal devices of the electronic system 1000. In one or more implementations, the bus 1008 communicatively connects the one or more processor(s) 1012 with the ROM 1010, the system memory 1004, and the permanent storage device 1002. From these various memory units, the one or more processor(s) 1012 retrieve instructions to execute and data to process in order to execute the processes of the subject disclosure. The one or more processor(s) 1012 can be a single processor or a multi-core processor in different implementations.

The ROM 1010 stores static data and instructions that are needed by the one or more processor(s) 1012 and other modules of the electronic system 1000. The permanent storage device 1002, on the other hand, may be a read-and-write memory device. The permanent storage device 1002 may be a non-volatile memory unit that stores instructions and data even when the electronic system 1000 is off. In one or more implementations, a mass-storage device (such as a magnetic or optical disk and its corresponding disk drive) may be used as the permanent storage device 1002.

In one or more implementations, a removable storage device (such as a floppy disk, flash drive, and its corresponding disk drive) may be used as the permanent storage device 1002. Like the permanent storage device 1002, the system memory 1004 may be a read-and-write memory device. However, unlike the permanent storage device 1002, the system memory 1004 may be a volatile read-and-write memory, such as random access memory. The system memory 1004 may store any of the instructions and data that one or more processor(s) 1012 may need at runtime. In one or more implementations, the processes of the subject disclosure are stored in the system memory 1004, the permanent storage device 1002, and/or the ROM 1010. From these various memory units, the one or more processor(s) 1012 retrieve instructions to execute and data to process in order to execute the processes of one or more implementations.

The bus 1008 also connects to the input and output device interfaces 1014 and 1006. The input device interface 1014 enables a user to communicate information and select commands to the electronic system 1000. Input devices that may be used with the input device interface 1014 may include, for example, alphanumeric keyboards and pointing devices (also called "cursor control devices"). The output device interface 1006 may enable, for example, the display of images generated by the electronic system 1000. Output devices that may be used with the output device interface 1006 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

As shown in FIG. 10, the bus 1008 also couples the electronic system 1000 to one or more networks (not shown) through one or more network interface(s) 1016. One or more network interface(s) may include an Ethernet interface, a WiFi interface, a cellular interface, a mmWave interface, a reduced gigabit media independent interface (RGMII), or generally any interface for connecting to a network. The one or more network interfaces 1016 may include, or may be coupled to, a physical layer module. In this manner, the electronic system 1000 can be a part of one or more networks of computers (such as a local area network ("LAN"), a wide area network ("WAN"), or an Intranet, or a network of networks, such as the Internet. Any or all components of the electronic system 1000 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, race-track memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device comprising:
    at least one transmitter circuit configured to:
        perform error correction coding to generate codewords at a first code rate using at least one of a locally stored parity check matrix or generator matrix, the codewords including data bits and parity bits;
        puncture a number of bits from a location within each of the codewords to puncture the codewords and to implement a second code rate that is greater than the first code rate without modifying the at least one of the locally stored parity check matrix or generator matrix, wherein the location within each of the codewords to puncture the number of bits is based on a link condition between the device and at least one receiver device, the punctured number of bits including at least one of the data bits; and transmit the punctured codewords, each of the transmitted punctured codewords including at least one of the data bits and at least one of the parity bits.

2. The device of claim 1, wherein the transmitter circuit is further configured to:

negotiate, with the at least one receiver device, the number of bits to puncture from each of the codewords and the location within each of the codewords to puncture the number of bits.

3. The device of claim 1, wherein the transmitter circuit is further configured to:

transmit, to the at least one receiver device, an indication of the number of bits being punctured from each codeword and the location of the number of bits being punctured from each codeword.

4. The device of claim 1, further comprising at least one memory circuit configured to store, prior to the error correction coding, the number of bits to puncture from each codeword and the location of the number of bits to puncture from each codeword.

5. The device of claim 1, wherein the at least one transmitter circuit is further configured to modify at least one of the number of bits or the location based at least in part on a change in the link condition.

6. The device of claim 1, further comprising at least one receiver circuit configured to:

receive bit sequences comprising received punctured codewords;

insert bits into the bit sequences to compensate for the puncturing; and perform error correction decoding on the bit sequences including the inserted bits.

7. A system comprising:

at least one receiver circuit configured to:

receive, from at least one transmitter circuit, bit sequences comprising punctured codewords, the received punctured codewords including data bits and parity bits;

insert bits into the bit sequences based at least in part on at least one puncturing parameter to compensate for puncturing of the punctured codewords, the at least one puncturing parameter indicating a location in the bit sequences to insert the bits based on a link condition between the at least one receiver circuit and the at least one transmitter circuit, at least one of the bits being inserted into a portion of at least one of the bit sequences that comprise at least one of the data bits; and perform error correction decoding on the bit sequences including the inserted bits to recover data bits.

8. The system of claim 7, wherein the bit sequences comprise soft or hard decision sequences.

9. The system of claim 8, wherein the at least one receiver circuit is further configured to negotiate, with the at least one transmitter circuit, the at least one puncturing parameter.

10. The system of claim 9, wherein the at least one puncturing parameter comprises a puncturing pattern.

11. The system of claim 10, wherein puncturing of the puncturing pattern differs from a first punctured codeword of the punctured codewords to a second punctured codeword of the punctured codewords.

12. The system of claim 10, wherein the puncturing of the puncturing pattern differs from a first packet comprising a first portion of the punctured codewords to a second packet comprising a second portion of the punctured codewords.

13. The system of claim 7, further comprising a memory configured to store, prior to receiving the bit sequences, the at least one puncturing parameter.

14. A method by a device, comprising:

determining that a target code rate falls between a first code rate of a plurality of preconfigured code rates and a subsequent code rate of the plurality of preconfigured code rates, the subsequent code rate being a next higher code rate of the plurality of preconfigured code rates subsequent to the first code rate;

selecting, based on the determining, the first code rate for error correction coding;

performing the error correction coding to generate codewords at the first code rate;

puncturing bits from the codewords to puncture the codewords and to implement the target code rate that is greater than the first code rate, the punctured bits including at least one data bit; and transmitting the punctured codewords to at least one receiver device, the transmitted punctured codewords including data bits and parity bits.

15. The method of claim 14, wherein a first number of bits are punctured from a first codeword of the codewords and a second number of bits are punctured from a second codeword of the codewords, wherein the first number of bits differs from the second number of bits.

16. The method of claim 14, wherein a first number of bits are punctured at a first offset within a first codeword of the codewords and a second number of bits are punctured from a second offset within a second codeword of the codewords, the first offset differing from the second offset.

17. The method of claim 16, wherein the first number of bits differs from the second number of bits.

18. The method of claim 16, further comprising:

negotiating, with the at least one receiver device, at least one of the first or second number of bits based at least in part on at least one link condition.

19. The method of claim 14, further comprising:

modifying a number of bits punctured from at least one of the codewords based at least in part on a detected change in a link condition.

20. The method of claim 19, wherein the number of bits is modified based at least in part on a pre-stored pattern.

* * * * *